United States Patent
Lin et al.

(10) Patent No.: US 7,977,755 B2
(45) Date of Patent: Jul. 12, 2011

(54) SUSPENDED NANOCHANNEL TRANSISTOR STRUCTURE AND METHOD FOR FABRICATING THE SAME

(75) Inventors: Horng-Chih Lin, Hsinchu (TW); Chun-Jung Su, Gueiren Township, Tainan County (TW); Hsing-Hui Hsu, Taipei (TW); Guan-Jang Li, Puzih (TW)

(73) Assignee: National Chiao Tung University, Hsinchu (TW)

( * ) Notice: Subject to any disclaimer, the term of this patent is extended or adjusted under 35 U.S.C. 154(b) by 208 days.

(21) Appl. No.: 12/314,796

(22) Filed: Dec. 17, 2008

(65) Prior Publication Data
US 2010/0096704 A1 Apr. 22, 2010

(30) Foreign Application Priority Data
Oct. 17, 2008 (TW) .............................. 97139994 A

(51) Int. Cl.
*H01L 29/68* (2006.01)

(52) U.S. Cl. ......... 257/410; 257/E29.255; 257/E29.299; 977/762; 977/814; 977/938

(58) Field of Classification Search .................. 257/410, 257/E29.255, E29.299; 977/762, 814, 938
See application file for complete search history.

(56) References Cited

U.S. PATENT DOCUMENTS
7,727,830 B2 * 6/2010 Jin et al. .................... 438/197
2006/0091481 A1 * 5/2006 Li et al. ...................... 257/401
2008/0246021 A1 * 10/2008 Suk et al. ..................... 257/24

FOREIGN PATENT DOCUMENTS
TW I246541 B 1/2006

OTHER PUBLICATIONS

N. Abele, A. Villaret, A. Gangadharaiah, C. Gabioud, P. Ancey, and A.M. Ionescu; 1T MEMS Memory Based on Suspended Gate MOSFET, IEDM, 2006.
X.L. Feng, Rongrui He, Peidong Yang, and M.L. Roukes; Very High Frequency Silicon Nanowire Electromechanical Resonators, Nano Letters, 2007, vol. 7, No. 7, 1953-1959.

* cited by examiner

*Primary Examiner* — Benjamin P Sandvik
*Assistant Examiner* — W. Wendy Kuo
(74) *Attorney, Agent, or Firm* — Rosenberg, Klein & Lee

(57) ABSTRACT

The present invention discloses a suspended nanochannel transistor structure and a method for fabricating the same. The transistor structure of the present invention comprises a substrate; a side gate formed on the substrate; a dielectric layer covering the substrate and the side gate; a suspended nanochannel formed beside the lateral of the side gate with an air gap existing between the suspended nanochannel and the dielectric layer; a source and a drain formed over the dielectric layer and respectively arranged at two ends of the suspended nanochannel. The electrostatic force of the side gate attracts or repels the suspended nanochannel and thus fast varies the equivalent thickness of the side-gate dielectric layer. Thereby, the on/off state of the element is rapidly switched, or the initial voltage of the channel is altered.

10 Claims, 7 Drawing Sheets

SUSPENDED NANOCHANNEL TRANSISTOR STRUCTURE AND METHOD FOR FABRICATING THE SAME

BACKGROUND OF THE INVENTION

1. Field of the Invention

The present invention relates to a transistor structure and a method for fabricating the same, particularly to a suspended nanochannel transistor structure and a method for fabricating the same.

2. Description of the Related Art

Theoretically, a common semiconductor element can have a subthreshold swing (SS) of 60 mv/decade optimally. Thus, SG-MOSFET (suspended gate MOSFET), which integrates MEMS (Micro Electro Mechanical System) and MOSFET (Metal Oxide Semiconductor Field Effect Transistor), has been developed to achieve a better SS and a higher on/off current ratio, wherein the suspended gate structure provides adjustable gate capacitance to break through the theoretical SS limit and achieve a SS value of several mv/decade. However, the microelectromechanical structure thereinside increases the dimensions of the element (usually several to tens microns), and the larger dimensions of the element increase the difficulty of the etching process for fabricating suspended gates.

In a paper "IT MEMS Memory Based on Suspended Gate MOSFET", IEDM 2006, N. Abele et al., proposed a MEMS memory, which is based on a planar structure and a microelectromechanical process, wherein a selective dry etching process removes a sacrifice dielectric layer to form an air gap between the gate and the channel. However, in this prior-art, what is suspended is not the channel but the gate. Because of the planar structure, the air gap is very hard to fabricate, and the etching for the air gap must be undertaken with a selective dry etching process. Because of the difficulty of fabricating an air gap from the sacrifice dielectric layer, the fabricated air gap has a considerable thickness (more than 200 nm). Thus, the element has to use a very high operating voltage. A Taiwan patent No. 246541 disclosed a method for mass-fabricating a low-cost silicon nanowire, wherein a sensitizing agent and an activating agent catalyze the surface of a silicon substrate and enable metal atoms to adhere to the surface. Next, the silicon substrate is soaked in an acidic electroless plating liquid to form thereon a metal layer -containing catalytic metal particles. Next, the silicon substrate is placed in a high temperature tube furnace; then, the catalytic metal particles and the silicon atoms on the interface form a liquid silicide alloy. Because of the temperature gradient in the SLS (Solid-Liquid-Solid) chemical synthesis process, the silicon atoms are rearranged to form silicon nanowires by the catalytic effect. Although the prior-art patent can mass-fabricate silicon nanowires, it still has problems of alignment and pollution of residual catalytic metal.

In a paper "Very High Frequency Silicon Nanowire Electromechanical Resonators", Nano Lett., Vol. 7, pp. 1953-1959 (2007), X. L. Feng et al., used a VLS (Vapor-Liquid-Solid) process to fabricate suspended nanowire elements and studied the resonance performance thereof to evaluate the feasibility of functioning as a resonator. The prior art is a laboratory approach and hard to position and align the nanowires. Therefore, it is unsuitable for mass production. Besides, the nanowire element is a passive element because it has only a source electrode and a drain electrode.

Accordingly, the present invention proposes a novel low-voltage suspended nanochannel transistor and a method for fabricating the same to simplify the fabrication process, reduce the cost, overcome the conventional problems, and provide a better MEMS MOSFET.

SUMMARY OF THE INVENTION

The primary objective of the present invention is to provide a suspended nanochannel transistor structure and a method for fabricating the same, which uses the existing apparatuses and the compatible technologies to mass-fabricate a transistor structure at a high reproducibility with a simple and low-cost process.

Another objective of the present invention is to provide a suspended nanochannel transistor structure and a method for fabricating the same, which is applied to a switch element, wherein electrostatic force is applied to the suspended nanochannel to fast vary the equivalent thickness of the side-gate dielectric layer and increase the on/off current ratio of the switch element.

A further objective of the present invention is to provide a suspended nanochannel transistor structure and a method for fabricating the same, which is applied to a memory element, wherein the electrostatic force created by the side-gate voltage attracts or repels the suspended nanochannel and varies the equivalent thickness of the side-gate dielectric layer, whereby the initial voltage of the channel is altered.

To achieve the abovementioned objectives, the present invention proposes a suspended nanochannel transistor structure, which comprises a substrate; a side gate formed on the substrate; a dielectric layer covering the substrate and the side gate; a suspended nanochannel formed beside the lateral of the side gate with an air gap existing between the suspended nanochannel and the dielectric layer; a source and a drain formed over the dielectric layer and respectively arranged at two ends of the suspended nanochannel.

The present invention also proposes a method for fabricating a suspended nanochannel transistor structure, which comprises steps: providing a substrate; forming a side gate on the substrate; sequentially forming a dielectric layer and a sacrifice layer over the side gate and the substrate; forming a polysilicon layer on the sacrifice layer and performing a source ion implant and a drain ion implant on the polysilicon layer; patterning the polysilicon layer to form a nanochannel on the sidewall of the side gate and form a source and a drain over the dielectric layer and respectively at two ends of the nanochannel; and removing the sacrifice layer between the nanochannel and the side gate to form a suspended nanochannel and removing the sacrifice layer exposed outside the side gate, the source and the drain.

Below, the embodiments are described in detail to make easily understood the objectives, technical contents, characteristics and accomplishments of the present invention.

DETAILED DESCRIPTION OF THE INVENTION

Figure 1:
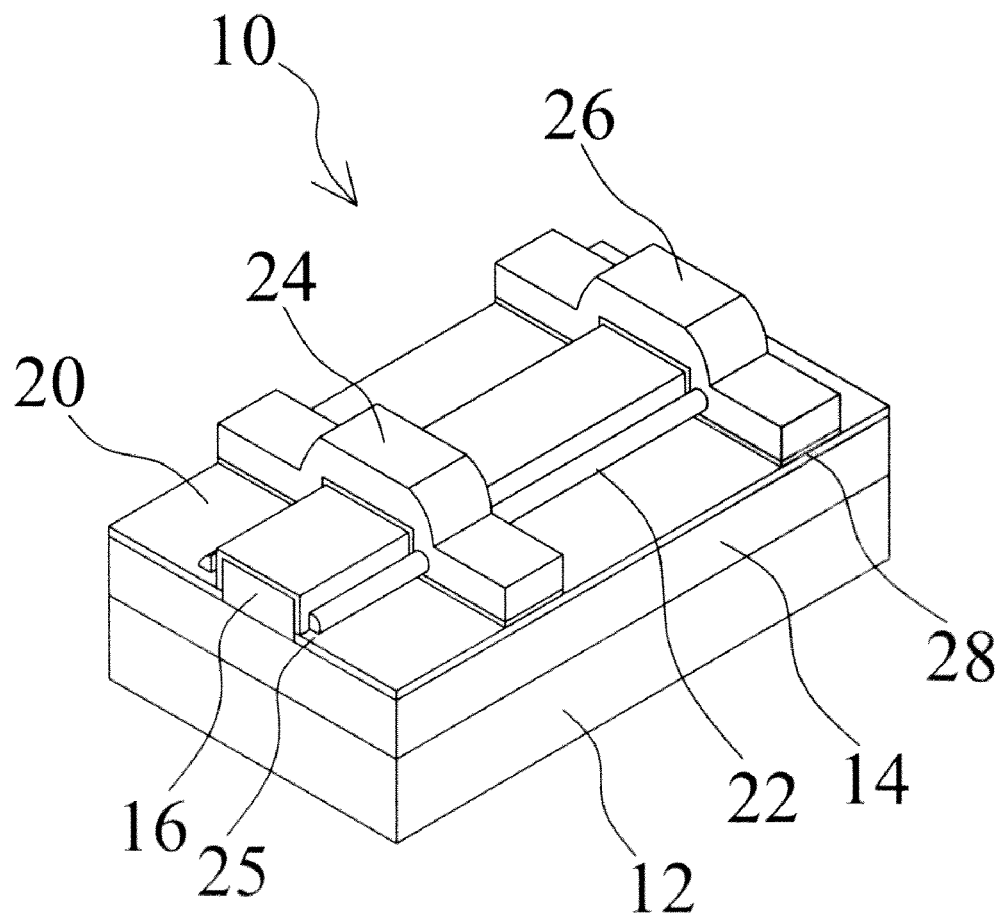
FIG. 1 is a diagram schematically showing a suspended nanochannel transistor structure according to one embodiment of the present invention.

Refer to FIG. 1 a diagram schematically showing a suspended nanochannel transistor structure according to one embodiment of the present invention. The suspended nanochannel transistor structure 10 of the present invention comprises a substrate 12; a thermal oxidation layer 14 formed on the substrate 12 and functioning as an insulation layer; a side gate 16 formed on the thermal oxidation layer 14; a dielectric layer 20 covering the side gate 16 and the thermal oxidation layer 14; at least one suspended nanochannel 22 formed on the lateral of the side gate 16 with an air gap 25 formed between the suspended nanochannel 22 and the dielectric layer 20; a source 24, and a drain 26, wherein the source 24 and the drain 26 are formed over the dielectric layer 20 and respectively arranged at two ends of the suspended nanochannel 22.

The substrate 12 may be a silicon substrate. The side gate 16 is made of a polysilicon. The source 24 and the drain 26 are made of ion-implanted polysilicon. The suspended nanochannel 22 is made of a polycrystalline material or a low-temperature recrystallization single crystal. The dielectric layer 20 is made of silicon nitride or silicon oxide. Besides, a sacrifice layer 28 exists below the source 24 and drain. 26 and functions as a junction layer between the dielectric layer 20 and the source 24/drain 26.

Below are described the process of a method for fabrication a suspended nanochannel transistor structure according to one embodiment of the present invention.

Figure 2:
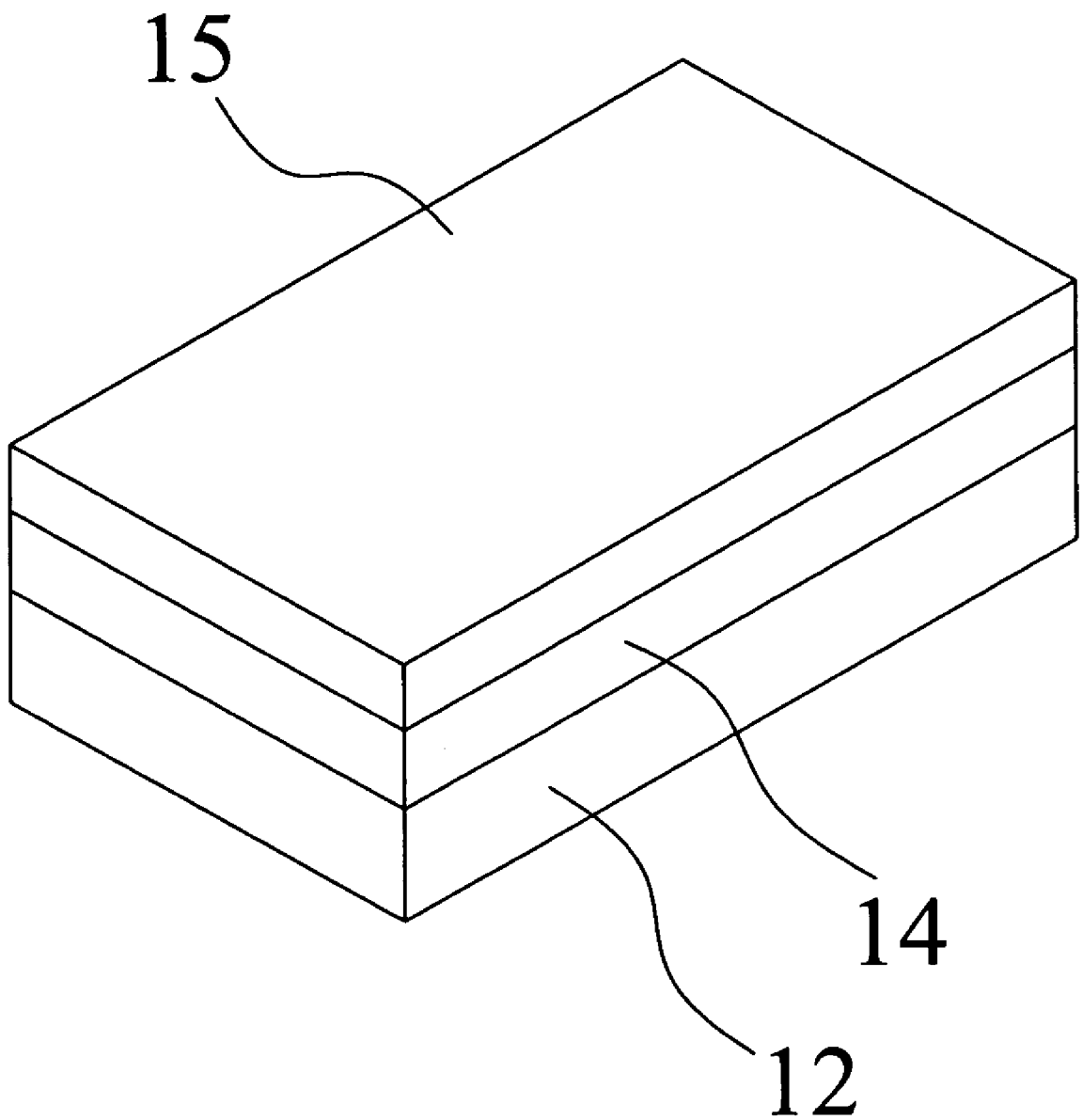
FIGS. 2-6 are diagrams schematically showing the process of a method for fabrication a suspended nanochannel transistor structure according to one embodiment of the present invention.
Figure 3:
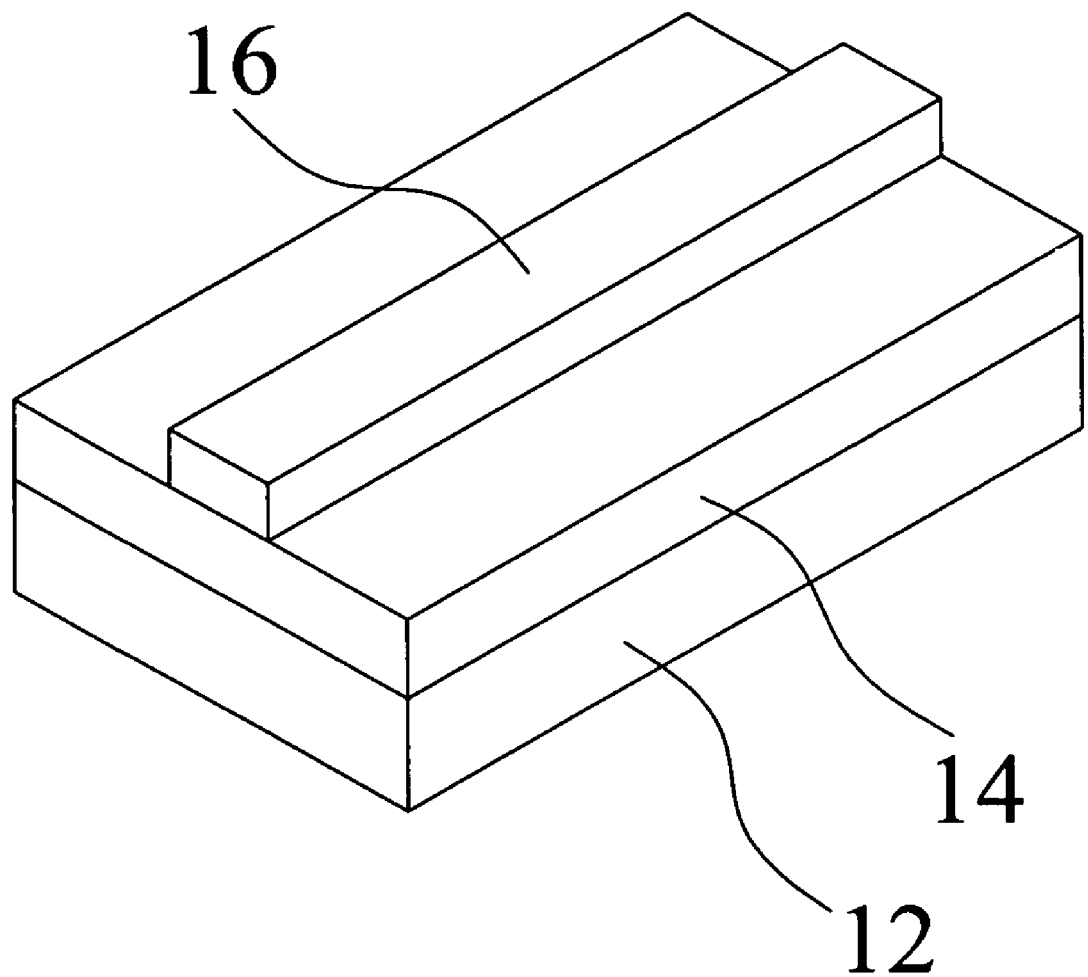
Figure 4:
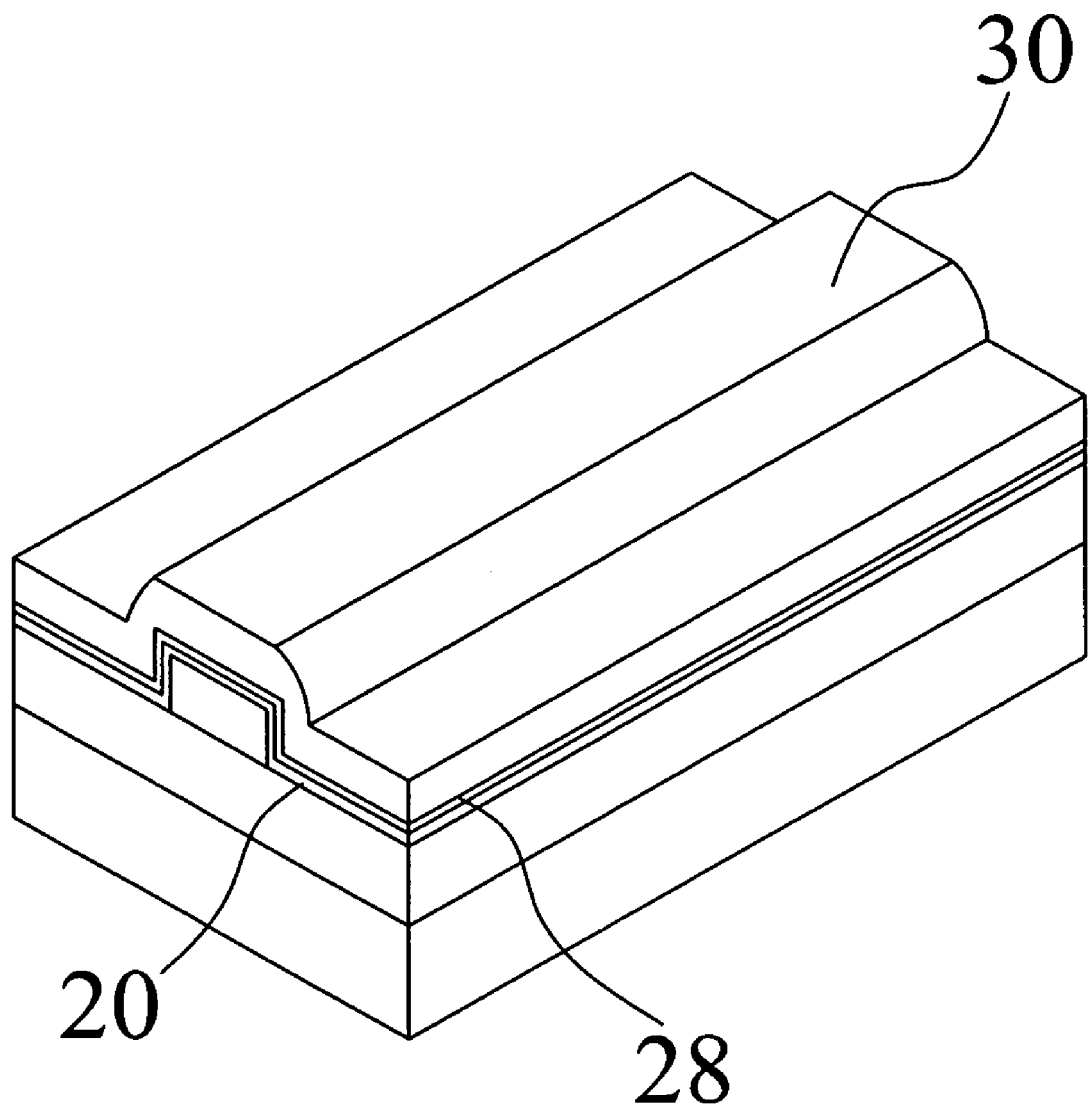
Figure 5:
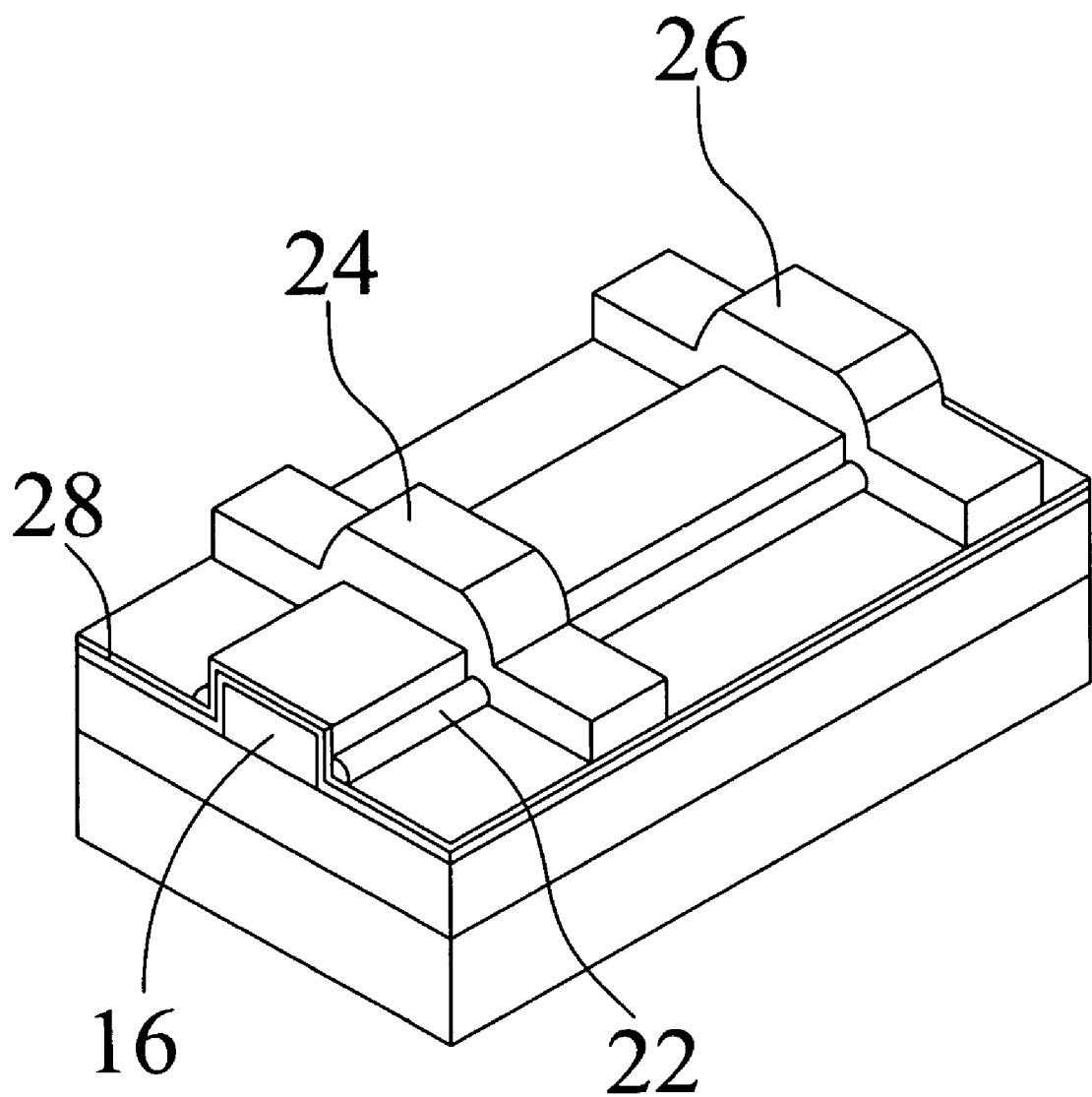
Figure 6:
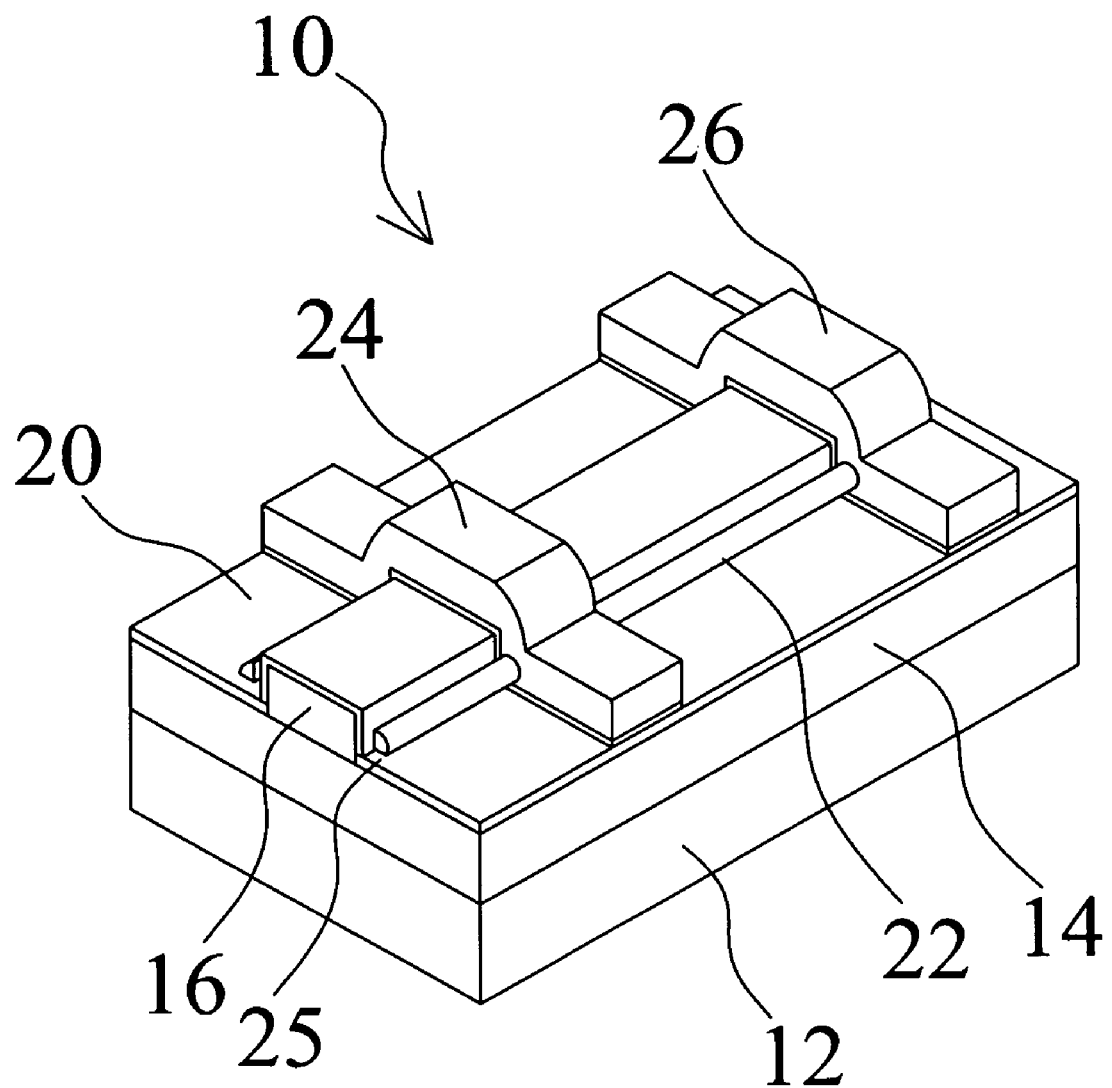

Refer to from FIG. 2 to FIG. 6 diagrams schematically showing the process of a method for fabrication a suspended nanochannel transistor structure. Firstly, as shown in FIG. 2, a silicon substrate 12 is provided, and a thermal oxidation layer 14 functioning as an insulation layer and a polysilicon layer 15 are sequentially formed over the silicon substrate 12. Next, as shown in FIG. 3, the polysilicon layer 15 is patterned to form a side gate 16. Next, as shown in FIG. 4, a dielectric layer 20, a sacrifice layer 28 having an etching selection ratio different from that of the dielectric layer 20, and a polysilicon layer 30 are sequentially formed over the structure shown in FIG. 3. Next, as shown in FIG. 5, a source ion implant and a drain ion implant are performed on the polysilicon layer 30, and a photolithographic process and an anisotropic etching technology are used to form a nanochannel 22 on the sacrifice layer 28 and beside the side gate 16, and also to form the structures of the source 24 and the drain 26. Next, as shown in FIG. 6, a selective etching technology is used to remove the sacrifice layer 28 between the nanochannel 22 and the side gate 16, and to remove the sacrifice layer 28 exposed outside the side gate 16, the source 24 and the drain 26. Thus, the nanochannel 22 is suspended.

Further, the suspended nanochannel 22 can be transformed from a polycrystalline state to a monocrystalline state via a low-temperature recrystallization technology to promote the reliability of the suspended nanochannel 22 during operation.

The abovementioned method is compatible with the current semiconductor fabrication process and apparatuses. The conventional etching technology for fabricating a gate sidewall spacer is also used to fabricate the sidewall spacer-like polysilicon nanochannel, wherein the polysilicon is etched with an anisotropic etching technology to fabricate the nanochannel, and the dimensions of the nanochannel are reduced to a nanometric scale with an appropriate etching time. In the present invention, the dimensions of the nanochannel are reduced to less than 100 nm. Thus, the present invention can mass-fabricate a suspended nanochannel at a high reproducibility with a simple and low-cost fabrication process. Therefore, the suspended nanochannel transistor structure and the method for fabricating the same of the present invention can overcome the technical and cost problems in the conventional technology of fabricating nanowire electronic elements.

Figure 7:
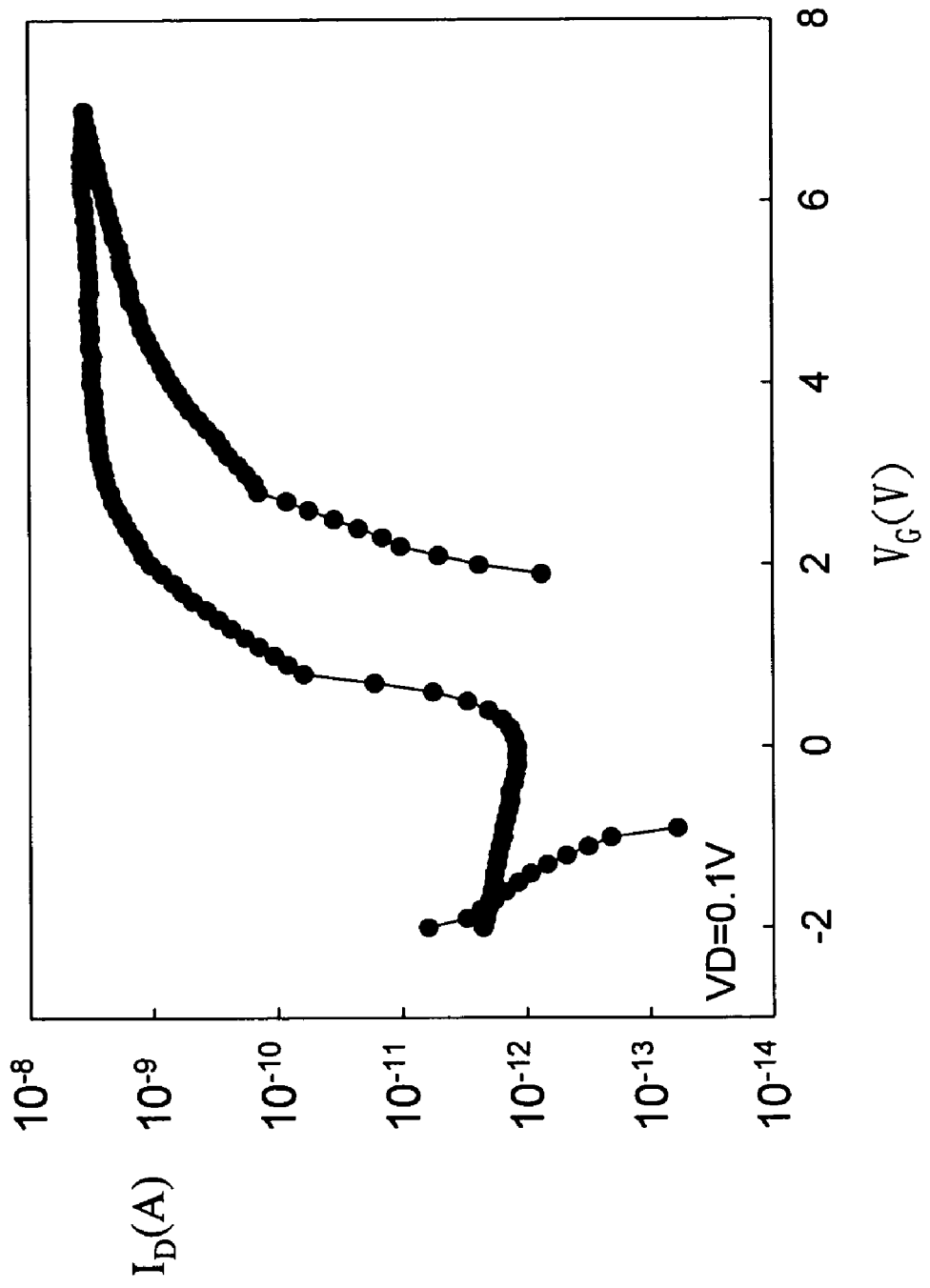
FIG. 7 is a diagram showing the electric characteristics of a suspended nanochannel transistor according to one embodiment of the present invention.

Refer to FIG. 7. In the present invention, as the nanochannel is suspended, there is an air layer existing between the nanochannel and the side gate to function as a dielectric material in addition to the dielectric layer. The voltage of the side gate generates electrostatic force to attract or repel the suspended nanochannel. Thus, varying the side-gate voltage can modify the equivalent thickness of the dielectric layer of the side gate and thus can adjust the initial voltage of the channel. Therefore, the present invention can apply to memory elements.

In the present invention, applying electrostatic force to the nanochannel can fast vary the equivalent thickness of the side-gate dielectric layer and thus can fast shift the on/off state of a switch element. Further, varying the equivalent thickness of the side-gate dielectric layer can also increase the on/off current ratio of a switch element.

If the electrostatic force is attractive force, the suspended nanochannel will be attracted to contact the dielectric layer of the sidewall of the gate. If the electrostatic force is repulsive force, the nanochannel will repelled away. Thereby, the structure of the present invention can present two logic states and can thus function as a switch element or a memory element.

In conclusion, the present invention proposes a suspended nanochannel transistor structure and a method for fabricating the same, which uses the current semiconductor fabrication process and apparatuses to mass-fabricate a suspended nanochannel transistor structure at a high reproducibility with a simple and low-cost process. The present invention is a transistor integrated with MEMS, and the side-gate capacitor thereof is a variable capacitor. Because of the air dielectric layer, the present invention has a very low turn-off current and consumes less power. Further, the present invention can operate at a low voltage and has high reliability.

The embodiments described above are only to exemplify the present invention but not to limit the scope of the present invention. Therefore, any equivalent modification or variation according to the spirit of the present invention is to be also included within the scope of the present invention.

What is claimed is:

1. A suspended nanochannel transistor struture, comprising:
   a substrate;
   a side gate formed on said substrate;
   a dielectric layer covering said substrate and said side gate;
   a suspended nanochannel having a suspended portion formed in a lateral relationship with said side gate and extending along said side gate with an air gap defined between said suspended portion of said suspended nanochannel and said dielectic layer; and
   a source and a drain formed over said dielectric layer and respectively arranged at two spaced apart locations on said suspended nanochannel.

2. The suspended nanochannel transistor structure according to claim 1, wherein a sacrifice layer exists below said source and said drain and functions as a junction layer between said dielectric layer and said source/said drain.

3. The suspended nanochannel transistor structure according to claim 2, wherein said sacrifice layer and said dielectric layer respectively have different etching selection ratios.

4. The suspended nanochannel transistor structure according to claim 1, wherein an insulation layer is formed on said substrate.

5. The suspended nanochannel transistor structure according to claim 1, wherein said dielectric layer is made of silicon nitride or silicon oxide.

6. The suspended nanochannel transistor structure according to claim 1, wherein said suspended nanochannel is made of monocrystalline silicon or polycrystalline silicon.

7. The suspended nanochannel transistor structure according to claim 1, wherein said substrate is a silicon substrate.

8. The suspended nanochannel transistor structure according to claim 1, which functions as a memory element or a switch element.

9. The suspended nanochannel transistor structure according to claim 1, wherein said suspended nanochannel has a dimension of smaller than 100 nm.

10. A suspended nanochannel transistor structure comprising:
- a substrate;
- a side gate formed on said substrate;
- a dielectric layer covering said substrate and said side gate;
- a suspended nanochannel formed in a lateral relationship with said side gate with an air gap existing between said suspended nanochannel and said dielectric layer;
- a source and a drain formed over said dielectric layer and respectively arranged at two spaced apart locations on said suspended nanochannel; and
- a sacrifice layer formed below said source and said drain, said sacrifice layer forming a junction layer between said dielectric layer and said source and drain.

* * * * *